(12) United States Patent
Tsai et al.

(10) Patent No.: US 9,536,762 B2
(45) Date of Patent: Jan. 3, 2017

(54) METHOD AND APPARATUS FOR THERMAL MAPPING AND THERMAL PROCESS CONTROL

(71) Applicant: Taiwan Semiconductor Manufacturing Company, Ltd., Hsin-Chu (TW)

(72) Inventors: Chun Hsiung Tsai, Hsinchu County (TW); Kei-Wei Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/539,844

(22) Filed: Nov. 12, 2014

(65) Prior Publication Data

US 2015/0069046 A1 Mar. 12, 2015

Related U.S. Application Data

(63) Continuation-in-part of application No. 12/789,816, filed on May 28, 2010, now abandoned.

(51) Int. Cl.
*H05B 1/02* (2006.01)
*H01L 21/67* (2006.01)
*H05B 3/00* (2006.01)
*G01J 5/00* (2006.01)
*H01L 27/146* (2006.01)

(52) U.S. Cl.
CPC ............ *H01L 21/67248* (2013.01); *G01J 5/00* (2013.01); *H01L 21/67115* (2013.01); *H05B 3/0047* (2013.01); *G01J 2005/0077* (2013.01); *G01J 2005/0085* (2013.01); *H01L 27/14649* (2013.01)

(58) Field of Classification Search
CPC ................... H01L 21/67248; H01L 21/67115; H01L 27/14649; H05B 3/0047; H05B 1/0233; G01J 5/00; G01J 2005/0077; G01J 2005/0085
USPC ........... 219/385, 502, 121.43, 483–486, 497; 393/416–418; 118/724, 725; 702/134–136, 702/99
See application file for complete search history.

(56) References Cited

U.S. PATENT DOCUMENTS

| 5,180,226 | A  | 1/1993  | Moslehi          |
| 5,376,592 | A  | 12/1994 | Hashiguchi et al. |
| 5,960,158 | A  | 9/1999  | Gat et al.       |
| 6,235,110 | B1 | 5/2001  | Naomoto et al.   |
| 6,475,815 | B1 | 11/2002 | Nambu et al.     |

(Continued)

FOREIGN PATENT DOCUMENTS

| JP | 5-264356    | 10/1993 |
| KR | 20080023848 | 3/2008  |

OTHER PUBLICATIONS

Mercury Vapor Light Source, PASCO (1990).

(Continued)

*Primary Examiner* — Mark Paschall
(74) *Attorney, Agent, or Firm* — Haynes and Boone, LLP

(57) ABSTRACT

A thermal processing apparatus is provided in accordance with some embodiments. The thermal processing apparatus includes a heating source for transmitting incident radiation to a work piece having a circuit pattern formed on a front surface; a radiation sensor configured to receive light radiated from the front surface of the work piece; and a controller coupled to the radiation sensor, the controller being designed to control the heating source to reduce temperature variation of the work piece.

20 Claims, 10 Drawing Sheets

(56) References Cited

U.S. PATENT DOCUMENTS

| | | | |
|---|---|---|---|
| 8,383,513 B2 | 2/2013 | Tsai et al. | |
| 2003/0203517 A1 | 10/2003 | Suzuki et al. | |
| 2004/0104346 A1 | 6/2004 | Devitt et al. | |
| 2005/0062388 A1 | 3/2005 | Camm et al. | |
| 2007/0020784 A1* | 1/2007 | Timans | G01J 5/0003 438/16 |
| 2009/0120924 A1* | 5/2009 | Moffatt | B23K 26/0626 219/385 |
| 2009/0255921 A1 | 10/2009 | Ranish et al. | |

OTHER PUBLICATIONS

Office Action dated Sep. 26, 2012, from correspondence application No. CN 201010549911.1.
Office Action dated Apr. 26, 2012, from correspondence application No. KR 10-2011-0010689.

\* cited by examiner

US 9,536,762 B2

METHOD AND APPARATUS FOR THERMAL MAPPING AND THERMAL PROCESS CONTROL

CROSS-REFERENCE

This application is a continuation-in-part of U.S. patent application Ser. No. 12/789,816 filed on May 28, 2010, the entire disclosure of which is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, when a thermal annealing process is applied to a semiconductor wafer, non-uniform thermal effect presents, resulting in device performance varies over different locations. However, there are no effective way to monitor the above non-uniformity and efficient way to reduce the non-uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
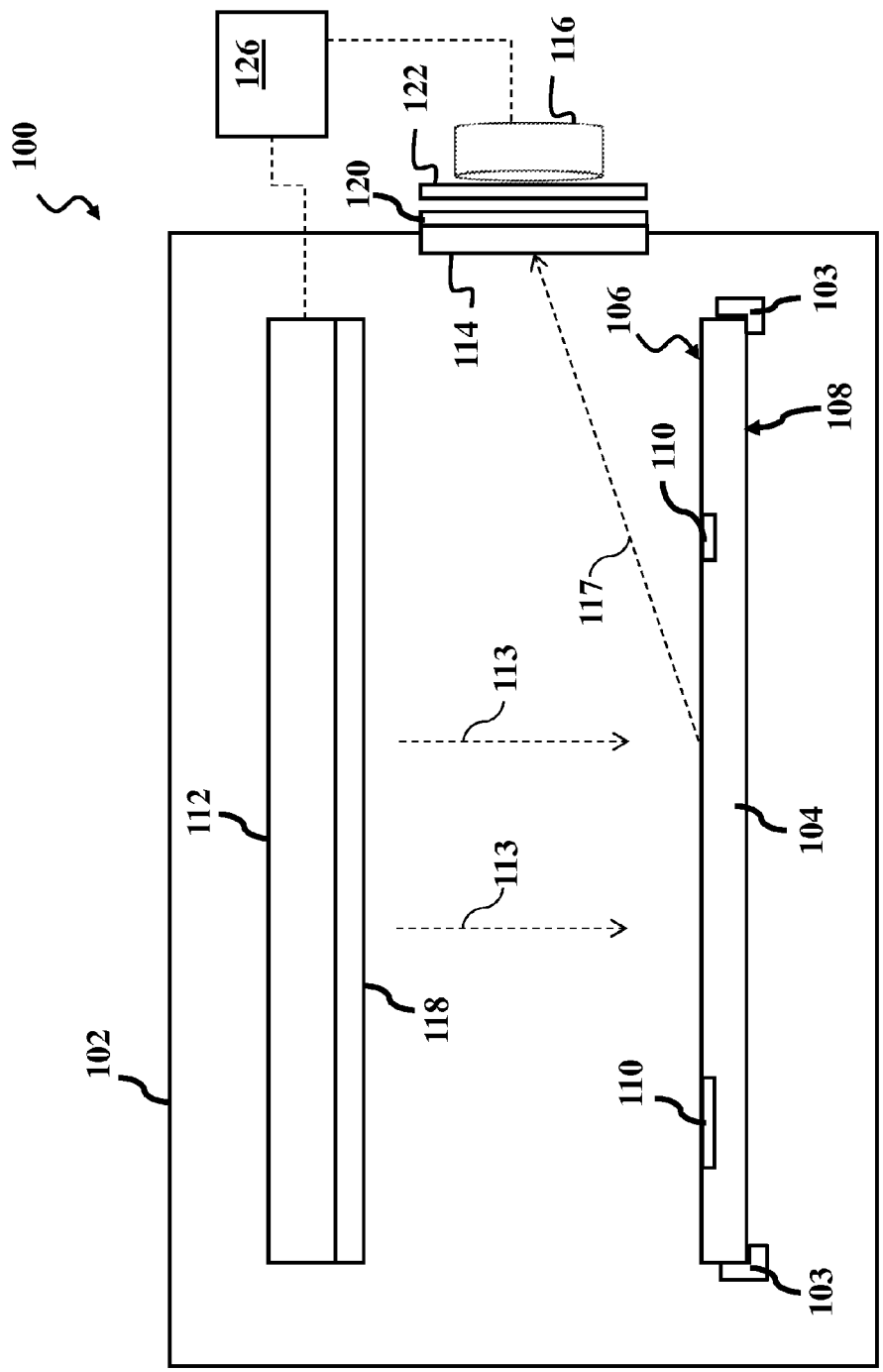
FIG. 1 is a schematic view of a thermal processing system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, the particular features, structures, or characteristics may be combined in any suitable manner in one or more embodiments. It should be appreciated that the following figures are not drawn to scale; rather, these figures are merely intended for illustration.

FIG. 1 is a schematic view of a thermal processing apparatus 100, constructed in accordance with some embodiments. The thermal processing apparatus 100 includes a processing chamber 102 having an enclosed space designed and configured for thermal processing, such as rapid thermal processing (RTP). The chamber 102 may include various mechanisms that are integrated together and operable for performing various functions associated with the corresponding thermal processes. In one example, the chamber 102 includes a mechanism to provide gas for purge and/or reaction (such as thermal oxidation).

The thermal processing apparatus 100 includes a rapid thermal processor, according to one embodiment of the present disclosure. Though one embodiment of the present disclosure includes a rapid thermal processor, the teachings of the present disclosure can be used in conjunction with any type of chambers used in thermal processing of electronic devices or packages. For the purposes of the present disclosure, the term "chamber" indicates any enclosure in which heat or light energy is applied to a work piece (such as a wafer) to heat, irradiate, dry, or cure the work piece.

The thermal processing apparatus 100 includes a substrate stage 103 designed to support and hold a work piece 104 for receiving the intended thermal process. The substrate stage 103 may include a proper mechanism to move the work piece 104. For example, the substrate stage 103 includes a mechanism to rotate the work piece around an axis perpendicular to a top surface 106 of the work piece 104 such that the thermal variation is averaged and reduced. In the present embodiment, the work piece 104 is a semiconductor substrate, such as a semiconductor wafer. In some examples, the semiconductor wafer is a silicon wafer. Alternatively or additionally, the semiconductor substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate is a semiconductor on insulator (SOI). In other alternatives, semiconductor substrate may include a doped epitaxy layer, and/or a semiconductor layer overlying another semiconductor layer of a different type, such as a silicon layer on a silicon germanium layer. The semiconductor substrate includes various doping configurations depending on design requirements of an integrated circuit to be formed thereon. In various examples, the semiconductor substrate may include various doped regions doped with p-type dopants, such as boron or $BF_2$; n-type dopants, such as phosphorus or arsenic; or combinations thereof. The doped regions may include p-type doped wells, n-type doped wells, n-type source and drain features, p-type source and drain features, and/or various channel doping features (e.g., anti-punch-trough doping). In various embodiments, the dopants may be introduced to the work piece 104 by ion implantation. After one or more ion implantation, a thermal annealing process may be implemented in the thermal processing apparatus 100 to activate the introduced dopants and reduce the damages from the corresponding ion implantations. In other examples, a thermal oxidation may be applied to the work piece 102 in the thermal processing apparatus 100 to form a thermal silicon oxide layer. The work piece 104 may alternatively include other objects, such as stacked wafers in 3D packaging, a printed circuit board, an electronic package, or any proper integrated circuit structure.

The semiconductor substrate 104 has a front surface 106 and a backside surface 108. Various integrated circuit (IC) features 110, such as doped features, are formed on the front surface of the semiconductor substrate 104. In various examples, the IC features 110 may include semiconductor features (such as source and drain features, channel doped features); dielectric features (such as shallow trench isolation features); conductive features (such as gate electrode, contacts, via, metal lines); or a combination thereof. The front surface 106 is different from the backside surface 108 in thermal characteristics, which will be further described later.

The thermal processing apparatus 100 includes a heating source 112 configured in the chamber 102 and is operable to provide thermal energy to the work piece 104 for thermal processing. The heating source 112 has a proper mechanism to provide thermal energy to the work piece 104. The heating source 112 may include a plurality of heat elements (such as halogen lamps) configured in an array for uniform and effective heating effect to the work piece 104. The heating source 112 generates radiation energy 113 directed toward the work piece 104. In the present embodiment, the radiation energy 113 is light with a spectrum that includes infrared radiation. In some examples, the heating source 112 includes a plurality of halogen lamps (such as Tungsten halogen lamps) configured in the chamber 102. It is understood by those skilled in the art that other radiation source may also be used. In particular examples, the heating source 112 includes multiple halogen lamps, ranging from 20 lamps to over 409 lamps. The halogen lamps are organized into zones ranging from 2 to 15 zones for heating power adjustment. Alternatively, each halogen lamp is a zone for individual power tuning. When Tungsten halogen lamps are used in the heating source 112, Tungsten halogen lamps emit infrared radiation in the short wavelength band corresponding to a wavelength range from about 0.35 μm to about 3 μm. During a thermal process, the work piece 104 is heated, and a light radiation 117 from the work piece 104 is generated. Particularly, the light radiation (target radiation) 117 from the work piece 104 and the light radiation (source radiation) 113 from the heating source 112 have different spectrums. An object, if a perfect black body, has radiation with a spectrum determined by Planck's law. From the Planck's law, the lower the temperature (K) of the object, the weaker the intensity of the light radiated from the body and the greater the component of a longer wavelength. Conversely, the higher the temperature of the object, the stronger the intensity of the light and the greater the component of a shorter wavelength. This is also true even if the object is not a perfect black body. In some embodiments for illustration, during the thermal process, the temperature of the work piece 104 ranges from about 600° C. to about 1300° C. The halogen lamps in the heating source may have a temperature greater than about 2000° C. during a thermal process. The radiation spectrum (source radiation spectrum) of the heating source 112 is different from the radiation spectrum (target radiation spectrum) of the work piece 104. The source radiation spectrum has more contribution from short wavelength and less contribution from long wavelength, compared with the target radiation spectrum. However, the two spectrums are overlapped, causing the issue of extracting the temperature signal from the work piece 104, which will be further discussed later.

The thermal processing apparatus 100 includes a viewport window 114 integrated in the chamber 102. The viewport window 114 includes a suitable material (such as glass) designed to be transparent to the light radiation 117. The thermal processing apparatus 100 further includes a radiation sensor (also referred to detector) 116 configured adjacent the viewport window 114 to receive the light radiation 117 from the work piece 104 through the viewport window 114. The radiation sensor 116 is sensitive to the light radiation 117 and is operable to detect the light radiation 117, thereby determining the temperature of the work piece 104 accordingly. By using the radiation sensor 116, the temperature of work piece 104 can be determined in a non-contact way by determining its radiation intensity or a characteristic parameter of the spectrum (such as the peak wavelength of the spectrum, described by Wien's law).

The radiation sensor 116 is a light sensor. In the present embodiment, the radiation sensor 116 is an inferred (IR) sensor that is sensitive to the IR light. In furtherance of the embodiment, the radiation sensor 116 includes a photodiodes sensitive to the IR light. A photodiode is a semiconductor device with a property of generating electrical energy (such as a current) when exposed to light (such as infrared radiation). The electrical energy is further used to determine the temperature of the object that radiates the light for temperature measurement, for example. The sensitivity of a photodiode is associated with the material used to make the photodiode since only photons with sufficient energy to excite electrons across the material's bandgap will produce significant photocurrents. In some embodiments, the radiation sensor 116 is designed to have a response spectrum that is effective to determine the temperature of an object (such as work piece 104), with a temperature range from about 600° C. to about 1,300° C. In various examples, the radiation sensor 116 may include lead sulfide (PbS) and lead selenide (PbSe) detectors operating in the wavelength region between about 1 μm to about 6 μm. Both PbS and PbSe photodiodes are photoconductive IR detectors that require a bias voltage to measure resistance drop when exposed to IR radiation. Also, one skilled in the art understands that the detector is chosen for its specific sensitivity and range of wavelengths to which it is responsive (along with necessary amplification requirements for signal generated). An example of a commercially available photoconductive type infrared detector suitable for one embodiment of the present disclosure is the IEEMAP-2DV, which is commercially available from Wilmington Infrared Technologies, Inc.

The radiation sensor 116 is integrated with the thermal processing chamber 102 and is configured at a location such that the light radiation 117 from the front surface 106 of the work piece 104 is collected by the radiation sensor 116. In a traditional thermal processing system, a thermal sensor is configured to receive the radiation from the backside surface of the wafer. However, such a system will only provide a wafer-level temperature data of a wafer and cannot provide pattern-associated temperature variations. The front surface 106 and backside surface 108 have different thermal profiles since the front surface 106 has a patterned structure (various IC features are formed on the front surface) while the backside surface 108 is a uniform surface without any pattern. On the front surface 106, various thermal relevant parameters (such as radiation absorption, radiation reflection and thermal energy diffusion) are different. As one example for illustration, the patterned features 110 are STI features of dielectric material, such as silicon oxide while the rest areas of the front surface 106 are active regions of semiconductor material (such as silicon), reflection, absorption, and diffusion of the STI features 110 are different from those in the semiconductor active regions. Furthermore, the pattern density on the front surface varies from one location to another location, which will cause thermal profile variation during the thermal process. This thermal variation further causes undesired device performance variation from location to location. Since the backside surface 108 is not patterned, there is no further pattern-related thermal variation on the backside surface 108. The impact of the thermal profile variation from the front surface 106 is substantially reduced or eliminated when reaching to the backside surface 108. Thus, the light radiation radiated from the backside surface 108 of the work piece 104 can be used to determine a wafer-wise average temperature but cannot catch the thermal profile variation in the front surface 106. Accordingly, the radiation sensor 116 is configured to receive the light radiation 117 radiated from the front surface 106 of the work piece 104.

Second, the signal collected by the radiation sensor 116 is not only from the target radiation 117 but also from the source radiation 113. This interference degrades the accuracy of the temperature measurement by the radiation sensor 116. In the conventional thermal processing system, the thermal sensor is configured to receive the light radiation from the backside surface of the wafer (as noted above), the wafer itself can function as an object to absorb the source radiation. The interference from the source radiation during the temperature measurement by the thermal sensor is substantially reduced. In the present case, the configuration of the radiation sensor 116 enables to receive the light radiation 117 from the front surface 106 of the work piece 104 but is also exposed to the light radiation 113 from the heating source 112. The interference is eliminated or reduced through other mechanism. In the disclosed embodiments of the thermal processing apparatus 100, two spectrum ranges (or wavelength ranges) are predetermined. A first wavelength range corresponds to significant portion of the light radiation from the heating source 112 in term of energy. The light radiation from the heating source 112 out of the first wavelength ranges has insignificant contribution of the thermal energy to the work piece 104. A second wavelength range corresponds to significant portion of the light radiation from the work piece 104 at raised temperature during the thermal process. The light radiation from the work piece within the second wavelength range is sufficient to determine the temperature of the work piece 104. The first and second wavelength ranges are different. In some embodiments, there is no overlapping between the first wavelength range and the second wavelength range. Particularly, the first wavelength range is associated with shorter wavelength, therefore also referred to short wavelength range. The second wavelength range is associated with longer wavelength, therefore also referred to long wavelength range. In some embodiments, the first wavelength range is from about 0.35 μm to about 3 μm and the second wavelength range is from 3 μm to about 6 μm. With two wavelength ranges defined above, the interference is eliminated or reduced by the one or more of mechanisms described below.

In some embodiments, the thermal processing system 100 includes a first filter 118 configured between the heating source 112 and the work piece 104 to band pass the light radiation within the first wavelength range. In other words, the first filter 118 is transparent to light radiation within the first wavelength range and is opaque to light radiation outside of the first wavelength range. Accordingly, the light radiation of the heating source 112 outside of the first wavelength range is filtered out.

In some embodiments, the thermal processing system 100 further includes a second filter 120 configured between the work piece 104 and the radiation sensor 116 to filter out the light radiation out of the first wavelength range and band pass the light radiation within the first wavelength range. Accordingly, the light radiation within the first wavelength range and directed to the radiation sensor 116 is detected by the radiation sensor 116 and is further used to determine the temperature of the work piece 104.

By integrating the first filter 118 and the second filter 120 in the thermal processing apparatus 100, the light radiated from the heating source 112 within the first wavelength range passes through the first filter 118 and is projected to the work piece 104 for heating effect during a thermal process. However, the light radiated from the front surface 106 of the work piece 104 within the second wavelength range passes through the second filter 120 and is projected to the radiation sensor 116 for temperature measurement of the work piece 104. The light directly radiated from the heating source 112 within the second wavelength range is blocked by the first filter 118 and cannot enter the radiation sensor 116. The light directly radiated from the heating source 112 within the first wavelength range is directed to the work piece 104 for heating effect but is blocked by the second filter 120 from entering the radiation sensor 116. Overall, the light radiation from the heating source 112 is able to heat the work piece 104 but does not interfere with the temperature measurement of the work piece 104 using light radiation from the work piece 104.

In some embodiment, the first filter 118 may be made of quartz or other suitable material for selective IR range transmission. The first filter 118 may be configured to be adjacent the heating source 112. In some other embodiments, the filter 118 may be integrated with the heating source 112 to achieve the same function. For example, the heating source 112 includes tungsten halogen lamps each further include tungsten filament sealed in a quartz bulb or a bulb of a proper material with proper coating.

In some embodiments, the second filter 120 is a filter configured between the viewport window 114 and radiation sensor 116. For example, the second filter is a transparent plate with a proper coating, such as multi-film coating, to achieve its filter function (block the light outside of the second wavelength range). In some embodiments, the second filter 120 is integrated with the viewport window 114 as a component. For example, the viewport window 114 is made of a proper material with expected transmission spectrum or is made of a transparent plate coated with multifilms to achieve the filtering function. In some other embodiments, the second filter 120 is integrated with the radiation sensor 116 as one component such that the radiation sensor 116 is sensitive (or responsive) only to the light within the second wavelength range. For example, the radiation sensor 116 includes a build-in filter or integrated filter in a same circuit substrate, which will be further described later.

Figure 2:
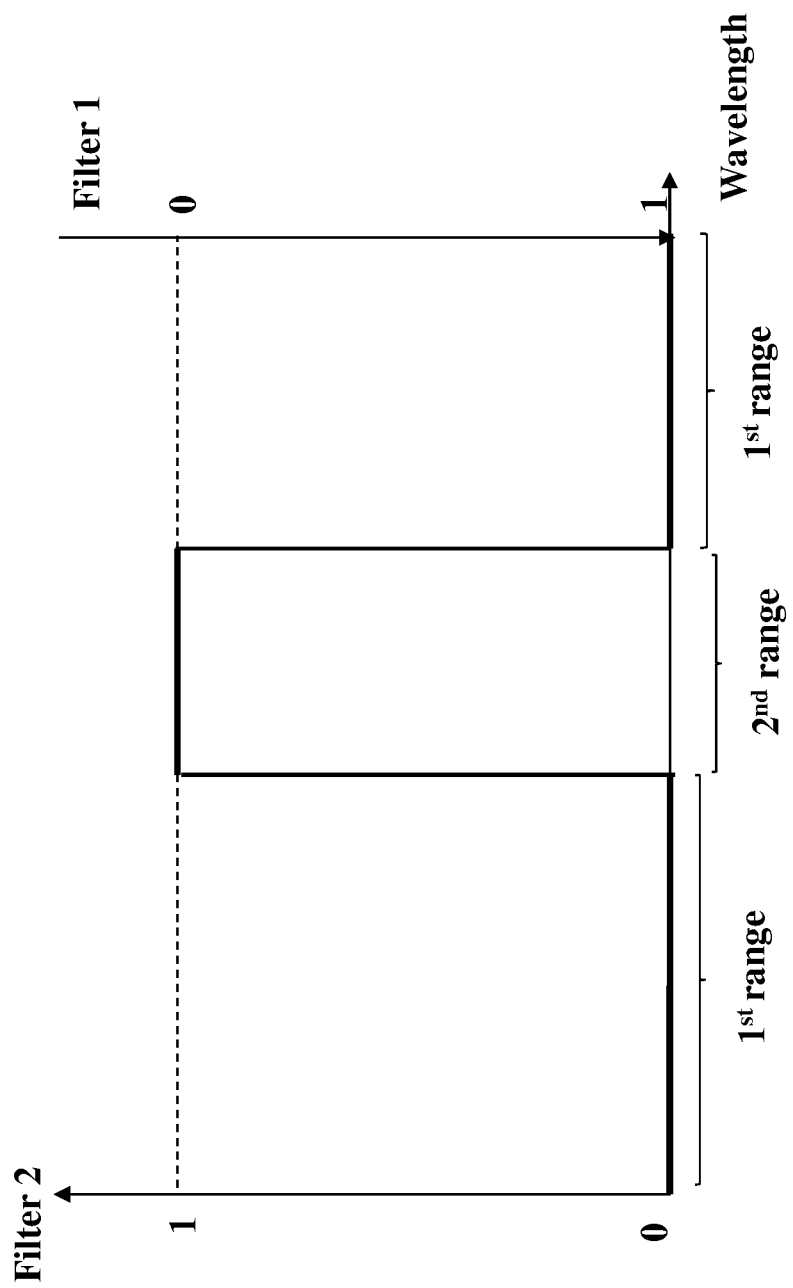
FIG. 2 is a diagram illustrating first and second wavelength ranges in accordance with some embodiments.

In some embodiments, the thermal processing apparatus 100 is designed such that the first and second filters are complimentary. Specifically, the second filter 120 is a bandpass filter that passes the light in the second wavelength range. The first filter 118 is a band-stop filter that stops (blocks) the light within the second wavelength range and passes the light outside of the second wavelength range. State differently, the light in the first wavelength range passes through the first filter 118 and is blocked by the second filter 120. As illustrated in FIG. 2, the horizontal axis represents wavelength of the light and the vertical axis represents the transmission of a filter. The left vertical axis represents the transmission of the second filter 120 and the right vertical axis represents the transmission of the first filter 118. The first wavelength range and the second wavelength ranges are labeled as well. As noted above, the second wavelength range is chosen to be sufficient in determining the temperature of the work piece 104 and is further chosen such that the complimentary second wavelength range corresponds to main radiation energy of the light radiated from the heating source 112. Thus, the heating source 112 is able to effectively heat the work piece 104 but is not interfered with the temperature measurement of the work piece 104 using the radiation sensor 116.

Figure 3:
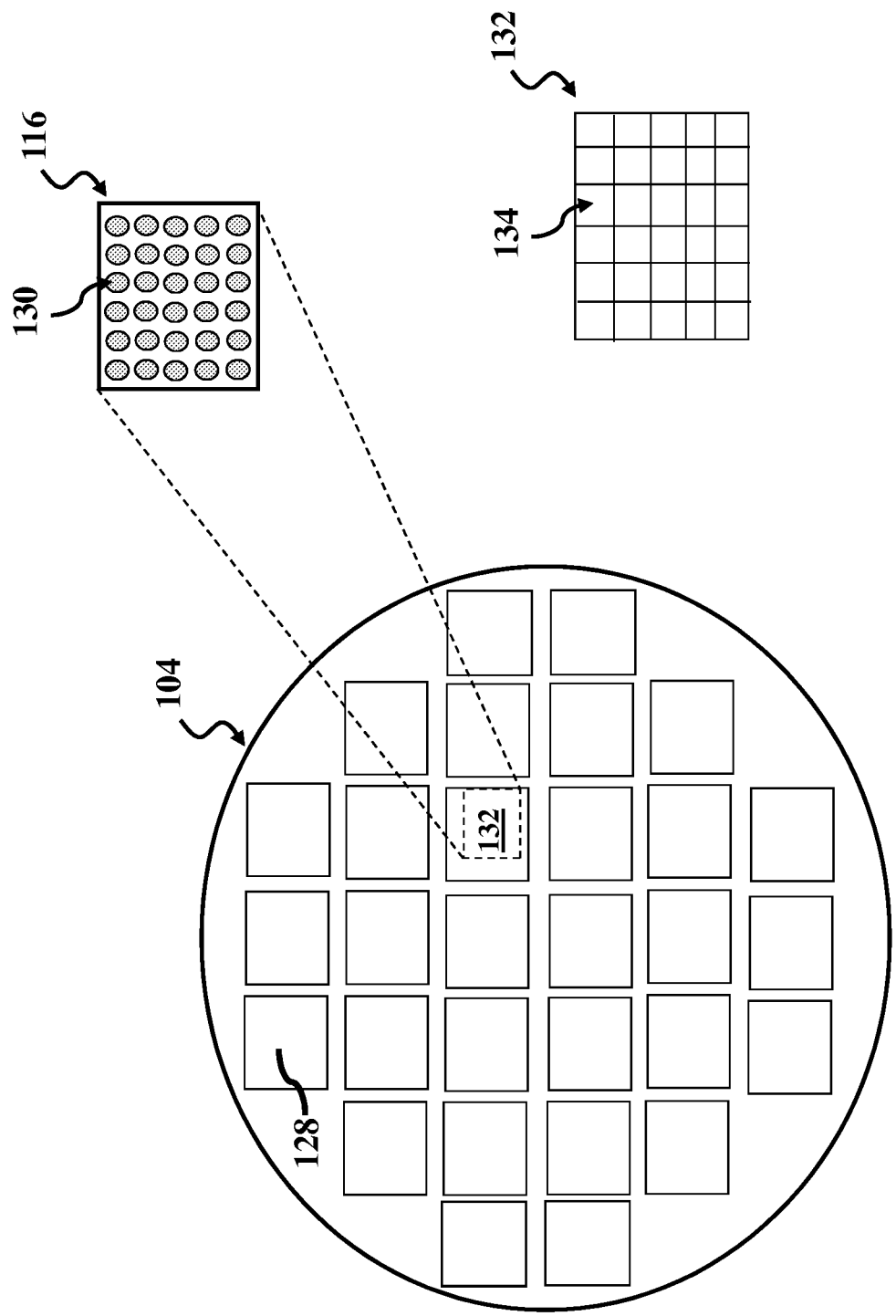
FIG. 3 illustrates the thermal processing system of FIG. 1 in portion in accordance with some embodiments.

By detecting the light radiation from the front surface 106 of the work piece 104, the radiation sensor 116 is able to catch the signal with pattern-related variation. By using the first and second filters (118 and 120), the interference between the source radiation and the target radiation is eliminated (or reduced), enhancing the spatial resolution of the temperature measurement by the radiation sensor 116. In order to measure and monitor temperature variation, the radiation sensor 116 is designed to have a plurality of pixels configured in a two-dimensional (2D) array to catch temperature of the work piece 104 at various locations, or more specifically, to catch a 2D thermal profile of the front surface 106 of the work piece 104 during the thermal process, such as illustrated in FIG. 3 in a schematic view of the thermal processing apparatus 100 in portion according to some embodiments. The radiation sensor 116 includes N×M sensing pixels 130, wherein N and M are any proper integers (e.g., 10 and 10) sufficient to catch thermal variations. Each sensing pixel 130 is an IC structure sensing to the light radiation from the work piece 104. In some embodiments, each sensing pixel 130 is a photodiode. In furtherance of the embodiments, the sensing pixels 130 are formed in one integrated circuit chip. For example, N×M photodiodes are formed in a semiconductor substrate and are connected to a read circuit to extract the data from the photodiodes.

Still referring to FIG. 3, the work piece 104 is illustrated with further details. In the present embodiment, the work piece 104 is a semiconductor wafer that includes a plurality of chips 128. A circuit is formed inside the circuit region of each chip 128. Circuit pattern may have pattern density variations over locations, which will cause the thermal profile variations, as noted above and referred to as pattern-loading effect. However, since such thermal profile variation corresponds to the pattern density variation and is in the scale much less than the chip size. For example, in order of few microns. Therefore, the radiation sensor 116 of a 2D pixel array is configured to catch an area inside a chip. Particularly, the light radiated from that area is focused to sensing pixels 130 in the pixel array of the radiation sensor 116. This area is referred to as target area 132. The target area 132 may be chosen differently but in a scale includes enough pattern-associated temperature variation. For example, the target area may choose an area of a similar area but extended over two or more chips 128. In some embodiments for illustration, the target area 132 includes a full circuit region of a chip 128. Alternatively, the target area 132 is a portion of the full circuit region. The light radiated from the target area is focused to the pixels 130 in the pixel array of the radiation sensor 116 and provides thermal signals of the target area, which are detected by the radiation sensor 116 for further determining the temperature spatial distribution over the target area 132 of the substrate 104. State differently, the thermal signals from the target area 132 are mapped to the sensing pixels 130 in the pixel array of the radiation sensor 116 through an imaging mechanism (or focus mechanism) 122. The target area 132 includes a plurality of subareas 134 mapped to the plurality of sensing pixels 130 such that the light radiated from one subarea 134 is a focused to and received by corresponding one of the sensing pixels 130. The subareas 134 and the sensing pixels 130 are paired in this manner. The subareas 134 are chosen with size such that the temperature variations associated with pattern density of the substrate 104 has a typical dimension comparable with the dimensions of the subareas 134. In some embodiments, a subarea 134 has a dimension less than about 0.5 mm while the target area 132 has a dimension greater than about 10 mm. Each of the thermal signals is from a different subarea 134 and is received by the corresponding sensing pixel 130.

In some embodiments, the imaging mechanism 122 includes a lens or a set of lenses configured to image the radiated light 117 from the target area to the sensing pixels 130 of the radiation sensor 116, which requires that not only the radiation sensor 116 catch the light radiated from the target area but also that the signals from the target area maps to the all pixels 130 in the array. In some other embodiments, the imaging mechanism 122 further includes a mechanism to zoom in or zoom out in order to change the size of the target area 132. In some other embodiments, the imaging mechanism 122 further includes a mechanism to change the focus location such that the target area 132 can be changed from location to location, such as from a center location to an edge location of the work piece. Thus, dynamically, the imaging mechanism 122 can sense different areas of the substrate 104 secured on the substrate stage 103. In some embodiments, the imaging mechanism 122 includes a micro-electromechanical system (MEMS), such as MEMS having a plurality of micro-lenses that are operable to achieve the above functions, such as scanning, repositioning, and/or zooming.

In some embodiments, the imaging mechanism 122 may be integrated in the radiation sensor 116. The radiation sensor 116 includes a plurality of sensing pixels 130 formed on an integrated circuit in a semiconductor substrate. Each sensing pixel 130 is a light sensitive device, such as a photodiode, designed to be sensitive to the light in the expected range. Furthermore, the radiation sensor 116 further includes a plurality of micro-lenses formed on the semiconductor substrate and disposed over the respective light sensitive devices in pair. Alternatively, the micro-lenses are additionally formed and work with a standalone imaging mechanism 122 for proper focusing function described above. Additionally or alternatively, a color filter layer may be formed on the semiconductor substrate of the radiation sensor such that the light 117 will be filtered before reaching the sensing pixels 113. The color filter in the radiation sensor 116 may replace the second filter 120 or works with the second filter 120 for filtering functions described above.

Therefore, by using the target radiation 117 radiated from the front surface 106 to determine the thermal profile of the target area, the thermal signals 117 will carry on the temperature variation associated with the pattern density of the patterned features 110 formed on the front surface 106 of the work piece 104. In contrast, the light radiated from the backside surface 108 has no temperature variation associated with the pattern density or a variation much less than that of the front surface 106, as explained above. Further, by the imaging mechanism 122 to catch the thermal signals from the target area within a chip 128 by the sensing pixels 130 of the radiation sensor 116, the thermal signals will carry enough temperature variation associated with the pattern density. Furthermore, by the disclosed system 100 and the corresponding method, the thermal profile of the target area of the substrate 104 is enhanced with better spatial resolution. Particularly, by using the first filter 118 to block the radiation from the heating source 112 within the second wavelength range, the radiation 113 from heating source 112 within the first wavelength range is able to effectively heat the substrate 104 and avoid to be interfered with the radiation signals within the second wavelength range, as the radiation signals being used for temperature determination by the radiation sensor 116. Further, by using the second filter 120, the light 117 radiated from the front surface 106 of the substrate 104 is further filtered out the portions beyond the second wavelength range to constitute the radiation signals within the second wavelength range, the interference between radiation 113 from the heating source 112 and the radiation 117 from the substrate 104 is further reduced or eliminated. The thermal signals after the second filter 120 has high quality and less noise, since any radiation from the heating source is blocked either by the first filter 118 or by the second filter 120.

The thermal processing system 100 further includes a controller 126 coupled with the radiation sensor 116 and the heating source 112. The controller 126 is designed to tune the heat power of the heating source 112 according to the extracted thermal profile of the target area 132 from the thermal signals detected by the radiation sensor 116. For example, the controller 126 may control the heating source 112 to tune the heating power to compensate thermal variation by various proper modes, such as individually controlling zone by zone or individually controlling lamp by lamp according to the temperature variations over location or dynamically controlling the heating power according to the temperature variation over time.

In some embodiments, the thermal signals from the front surface 106 of the substrate 104 may be further enhanced after the thermal signals being detected by the radiation sensor 116. This is explained below. As the target area 132 is mapped to the sensing pixels 130, the thermal signal from a subarea 134 of the target area 132 is focused to a corresponding sensing pixel 130 of the pixel array. In practice, the crosstalk may still exist, which means that the thermal signal detected by a sensing pixel 130 may not completely come from the corresponding subarea 134 and may further include contributions from other subareas 134. However, the contributions from other subareas 134 are less than the paired subarea 134. When a subarea is far away from the paired subarea 134, the contribution is far less. In other perspective, the radiation from one subarea 134 is not completely directed to the paired sensing pixel 130 but also has small portions directed to other sensing pixels. According to this understanding, a mathematical model can be built and used to process the thermal signals such that the crosstalk is reduced or eliminated. In some embodiments, the mathematical model has a form below, $$I(r_i)=\Sigma C(r_i,r_j)*S(r_j) \qquad (1)$$

Where the sum is over the subscript j. The subscripts i and j are integrals ranging from 1 to M*N (or the total number of the subareas 134 in the target area 132). The parameter $r_i$ represents ith subarea, $S(r_j)$ is the total radiation signal received by the sensing pixel 130 paired with the subarea $r_i$, $I(r_i)$ represents the total radiation intensity from the subarea $r_i$, and $C(r_i, r_j)$ is a matrix of coefficients associated with crosstalk or focus efficiency of the imaging mechanism 122, referred to as collection coefficient $C(r_i, r_j)$. The coefficient $C(r_i, r_j)$ is associated with the crosstalk between the ith subarea and jth subarea, or more particularly, associated with the radiation signal from the ith subarea 134 to the jth sensing pixel 130 relative to the total signal received by the jth sensing pixel 130. In an ideal case that there is no crosstalk, $C(r_i, r_j)=1$ if $r_i=r_j$, and $C(r_i, r_j)=0$ if $r_i \neq r_j$. In a real case, $C(r_i, r_j)$, even $r_i \neq r_j$, is not zero. The coefficients $C(r_i=r_j)$ may be determined according to the historic fabrication data from the thermal processing system 100. For examples, multiple wafers are thermal processed by the thermal processing system 100, the thermal data are collected and compared with the temperature profile determined otherwise as a reference. By choosing the proper coefficients $C(r_i=r_j)$, the thermal profile thus obtained has less difference from the thermal profile otherwise obtained. Thus, a thermal signal intensity $I(r_i)$ associated with the ith subarea 134 excludes the crosstalk from other subareas and includes additional relevant intensity extracted from other non-paired sensing pixels. The mathematical model, such as the one in eq. (1), is therefore constructed and implemented to reduce the crosstalk and further enhance the signal quality for better spatial resolution. In some embodiments, the mathematical model is integrated in the controller 126.

Figure 4:
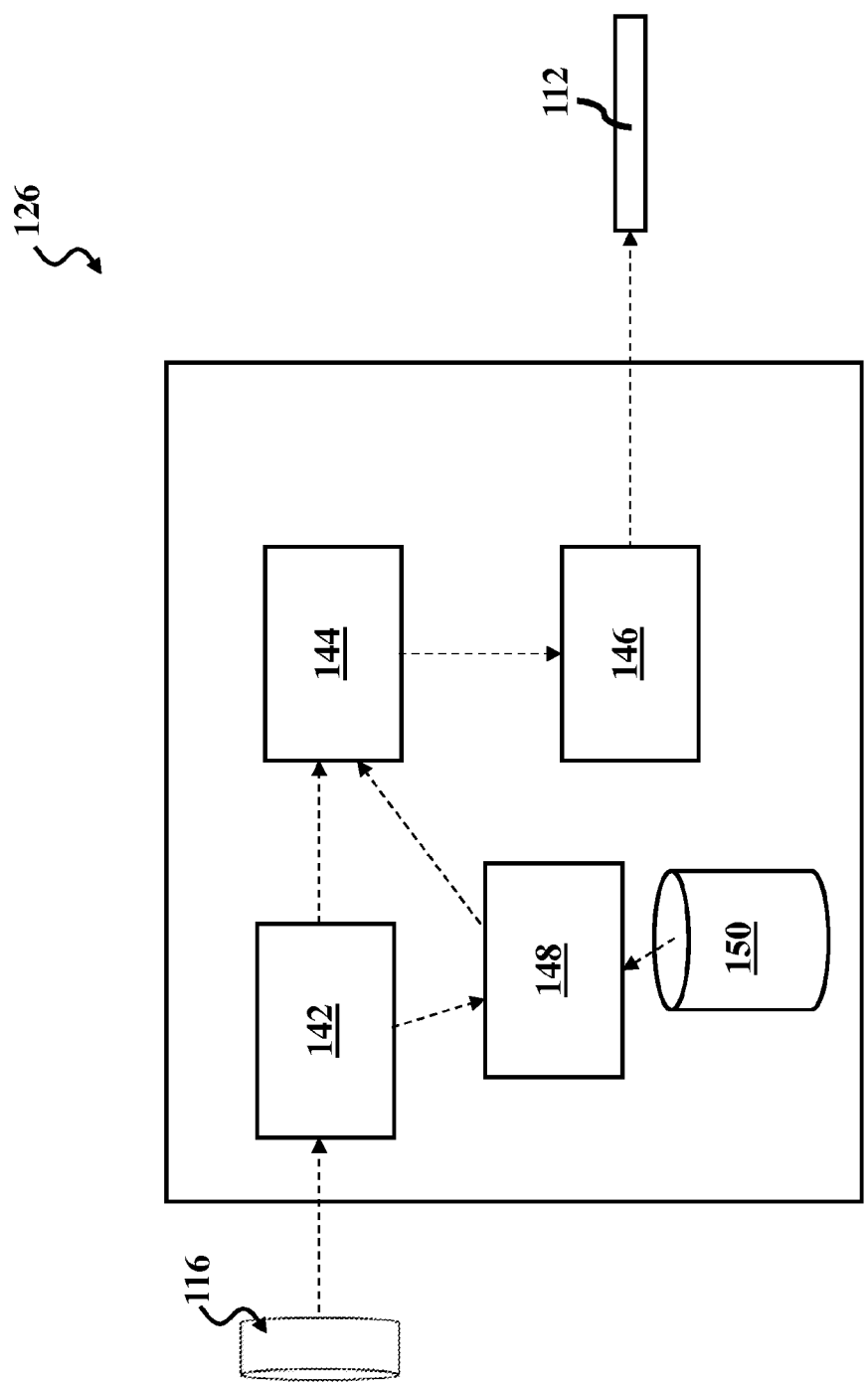
FIG. 4 is a block diagram of the controller in FIG. 1 in accordance with some embodiments.

FIG. 4 is a block diagram of the controller 126 in accordance with some embodiments. The controller 126 may include a current/voltage (I/V) converter 142 designed to convert an electric current signal from the radiation sensor 116 to an electric voltage signal. The I/V converter 142 may be coupled with the radiation sensor 116. In some examples, the signal from the I/V converter 142 are M*N temperature data corresponding to a thermal profile over the target area 132 of the substrate 104 at a time. The controller 126 may further includes a remote temperature controller (RTC) 144 coupled with the I/V converter 142. The RTC 144 may include a microprocessor or other circuit that is designed to take temperature feedback from the I/V converter 142 and determine how to compensate temperature variation by supplying proper power output to the heating source 112. The RTC 144 generates controlling signal according to the temperature feedback signal from the I/V converter 142. The controller 126 further includes a power supply module 146 to supply power to the heating source 112. The power supply module 146 may provide separate power lamps in different zones. In some embodiments, the power supply module 146 includes one or more silicon-controlled rectifier (SCR) to provide supply power to the heating source 116 in a certain mode, such as zone-based mode. The RTC 144 controls the power supply module 146 according to the temperature feedback. The RTC 144 may implement a proper feedback mechanism for temperature compensation. In some embodiments, the RTC 144 is a proportional-integral-derivative controller (PID controller). In some embodiments, the controller 126 further includes a resolution enhancer 148 to preprocess the temperature profile (temperature matrix) to reduce the crosstalk. In furtherance of the embodiments, the resolution enhancer 148 includes the mathematical model as expressed in eq. (1). The radiation signal from the I/V converter 142 is preprocessed by eq. (1). The resolution enhancer 148 takes $S(r_j)$ from the I/V converter 142 as input and generates $I(r_i)$ as the output. The enhanced data $I(r_i)$ are then sent to the RTC 144. The resolution enhancer 148 may be a separate module coupled with the I/V converter 142 and the RTC 144. Alternatively, the resolution enhancer 148 may be integrated in the RTC 144. The controller 126 may further include a database 150 to store fabrication data, such as historic data of wafers processed by the thermal processing system 100. Those data may be provided to the resolution enhancer 148 to determine the coefficients $C(r_i-r_j)$. The resolution enhancer 148 also includes a function to generate the coefficients $C(r_i-r_j)$ according to the historic data. The database 150 may alternatively or additionally include the coefficients $C(r_i-r_j)$ otherwise determined, such as input from engineers.

Figure 5:
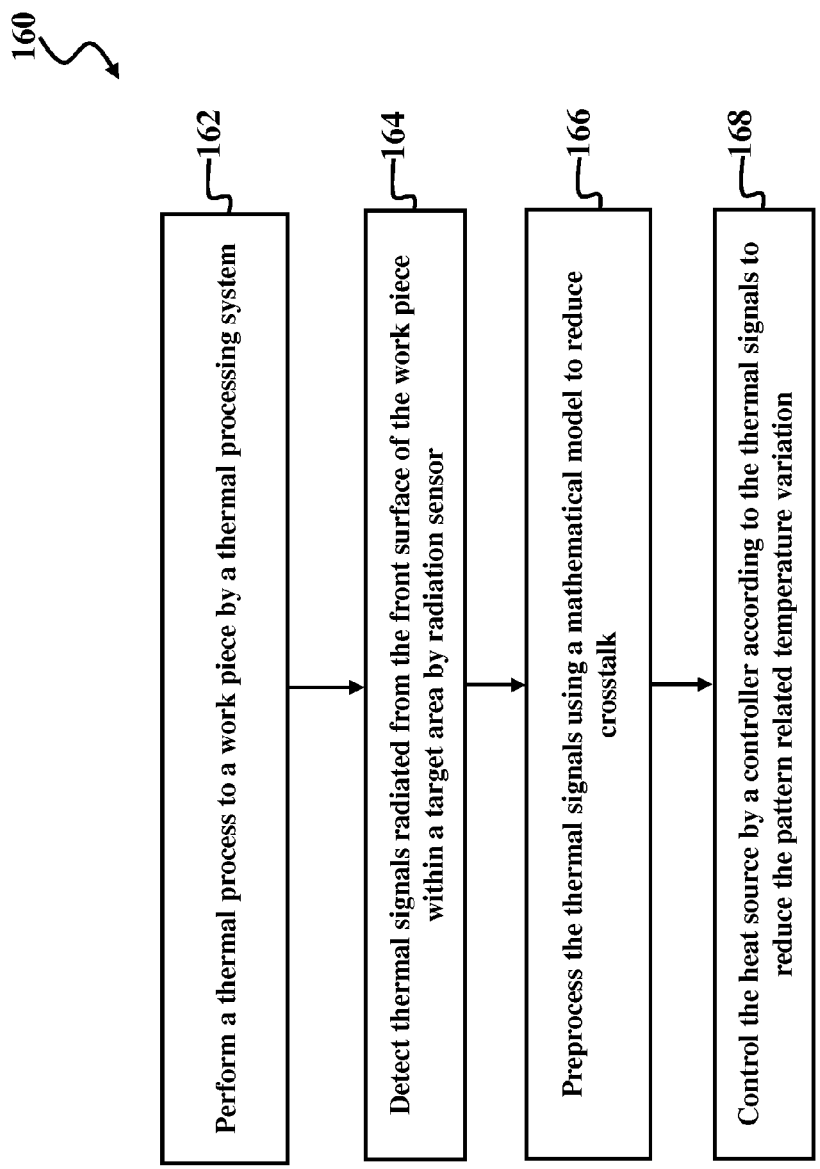
FIG. 5 is a flowchart of a method implemented with the thermal processing system of FIG. 1 in accordance with some embodiments.

FIG. 5 illustrates a flowchart of a thermal processing method 160 in accordance with some embodiments. The method 160 includes an operation 162 by performing a thermal process to the work piece 104 by the thermal processing system 100. As noted above, the thermal processing system 100 is designed to catch the thermal profile of the target area 132 of the work piece 104 with pattern density related temperature variation. For example, the thermal processing system 100 includes the heating source 112 configured to heat the work piece 104 from the front surface 106; the first filter 118 and the second filter 120; the radiation sensor 116 designed to be sensitive to the light within the second wavelength range; and the imaging mechanism 122 to map the thermal signals from the target area to the sensing pixels 130. In some embodiment, the thermal process is a thermal annealing process. In other embodiments, the thermal process may be a part of semiconductor fabrication process, such as a thermal oxidation process. In this case, the thermal oxidation process may include supplying oxygen and the thermal process simultaneously.

The method 100 includes an operation 164 by detecting the target radiation 117 radiated from the front surface of the work piece 104 within the target area 132 by the radiation sensor 116. The target radiation 117 includes thermal signals associated with different subareas 134. The thermal signals from the subareas 134 are mapped to the sensing pixels 130 of the radiation sensor 116, thereby determining the thermal profile of the target area 132.

The method 100 may include an operation 166 by preprocessing the thermal signal using the mathematical model, such as the mathematical model defined in eq. (1), to reduce the crosstalk and enhance the resolution of the thermal profile. The operation 166 may be implemented by the resolution enhancer 148 in the controller 126.

The method 100 includes an operation 168 by controlling the heating source 112 by the controller 126 according to the thermal signal (or preprocessed thermal signal) to reduce the pattern-related temperature variation. The operation 168 may control the heating source in a zone-based mode.

Figure 6:
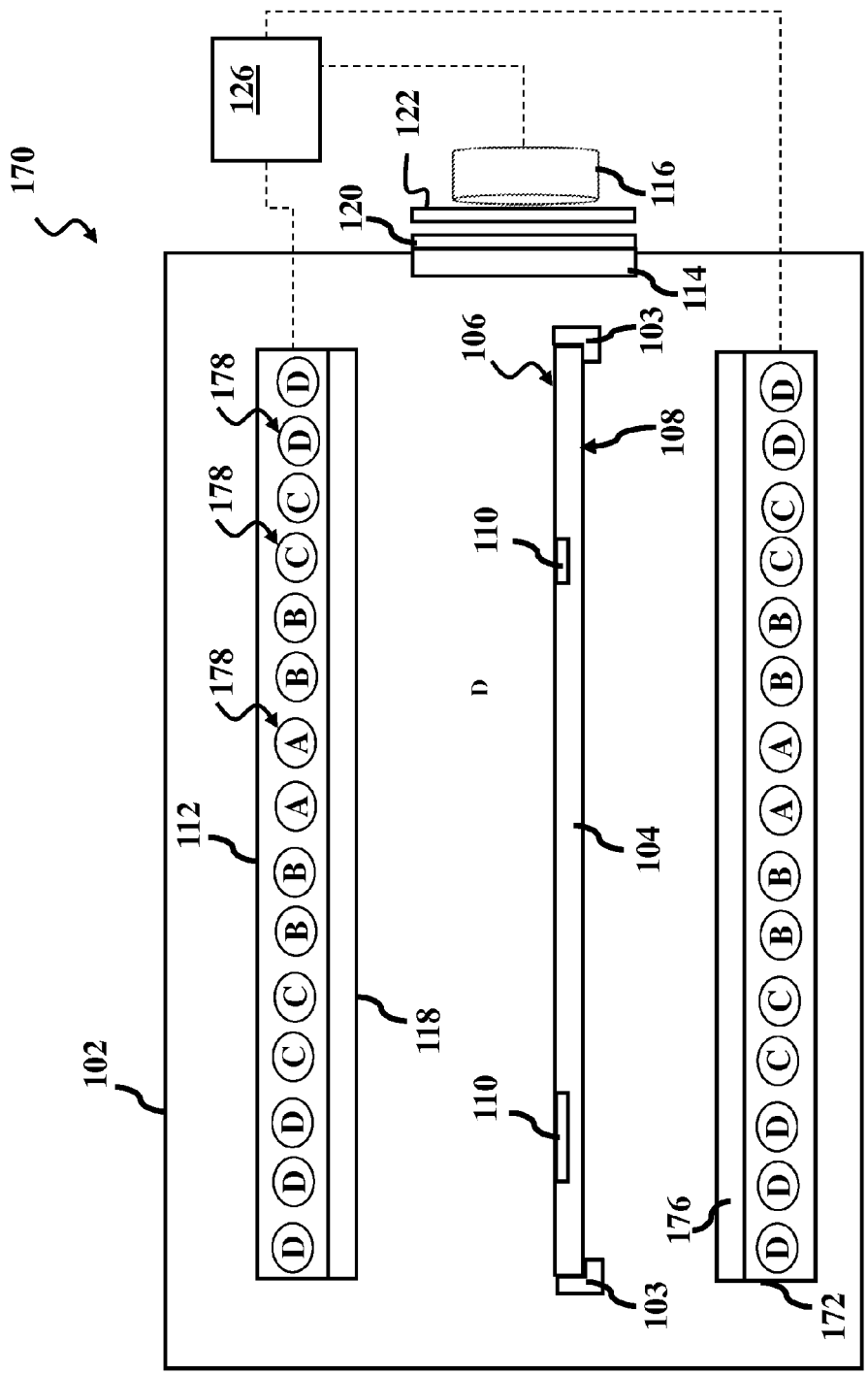
FIG. 6 is a schematic view of a thermal processing system in accordance with some embodiments.

FIG. 6 illustrates a thermal processing system 170 in accordance with some other embodiments. The thermal processing system 170 is similar to the thermal processing system 100. For example, the thermal processing system 170 includes the first heating source 112 configured to provide heating energy (radiation energy to the front surface 106 of the work piece 104 secure on the substrate stage 103. The thermal processing system 170 may include the first filter 118 and the second filter 120 configured for intended functions described above. The thermal processing system 170 further includes a second heating source 172 configured to provide heating energy to the backside surface 108 of the work piece 104. The second heating source 172 is similar to the first heating source 112 in terms of heating mechanism and structure in the present embodiment. The thermal processing system 170 may further include a third filter 176 configured to block the radiation from the second heating source 172 within the second wavelength range for the same reason (reducing the interference) described above regarding the first filter 118. The third filter 176 is similar to the first filter 118 in terms of function and structure. The controller 126 is coupled with both first and second heating sources to control the both. When the work piece 104 is able to absorb the radiation from the backside heating source 172, the third filter 176 can be eliminated.

Figure 7:
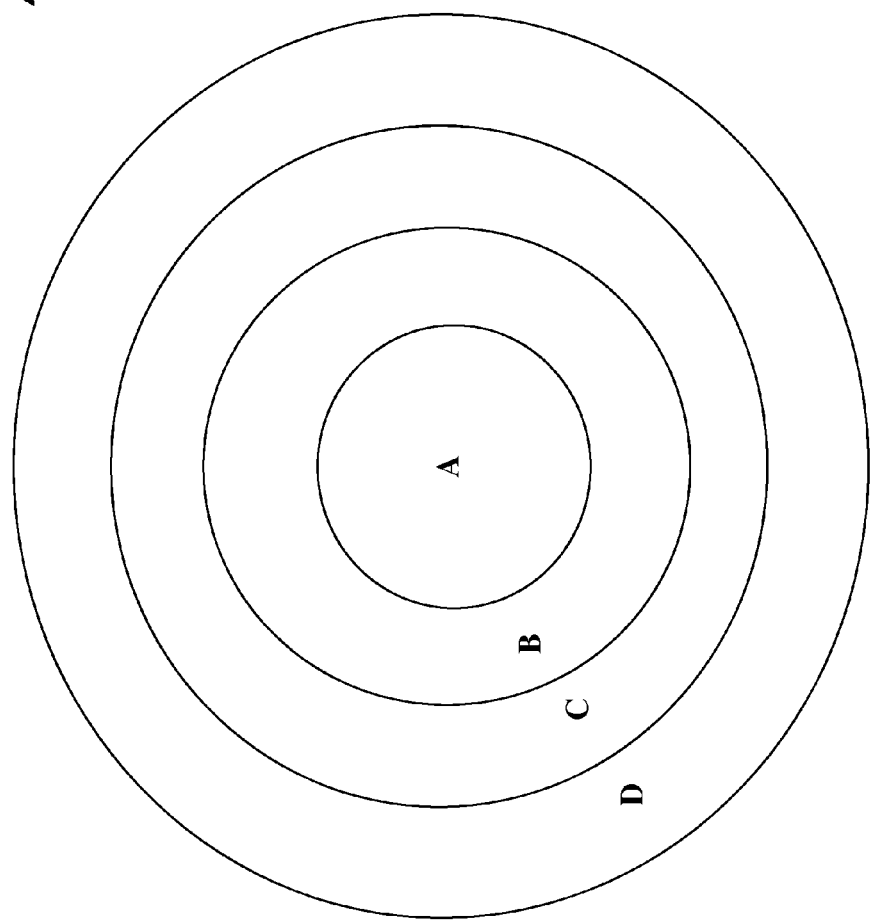
FIG. 7 is a top view illustrating various zones of the thermal processing system of FIG. 6 in accordance with some embodiments.

The heating source 112 and the heating source 172 are also referred to as front heating source 112 and backside heating source 172, respectively. The thermal processing system 170 includes the front heating source 112 and the backside heating sources 172 used to process the work piece 104. In some embodiments, the work piece 104 is raised or lowered by the substrate stage 103. Both the front and the backside heating sources (112 and 172) have a number of heating elements 178, which are controlled by zones, such as zones A, B, C, D. The front-end and backside heating sources are controlled by a controller 126. FIG. 7 shows a top view of four heating zones of FIG. 6, in accordance with some embodiments, as described in U.S. Pat. No. 8,383,513, the entire disclosure of which is hereby incorporated herein by reference. Each zone is controlled to provide heating power separately from other zones. FIG. 6 shows that the heating elements and heating zones of the front heating source and the backside heating sources are similar. However, they do not need to be. Heating elements of the front heating source can be configured and be controlled differently from the backside heating source. In addition, the zone division could also be different for the front heating source and the backside heating source. Further, the front heating source and backside heating source can be divided into 2, 3, 5, 6, or more zones, instead of 4 zones. In some embodiments, the front heating sources are controlled separately from the backside heating sources.

Figure 8:
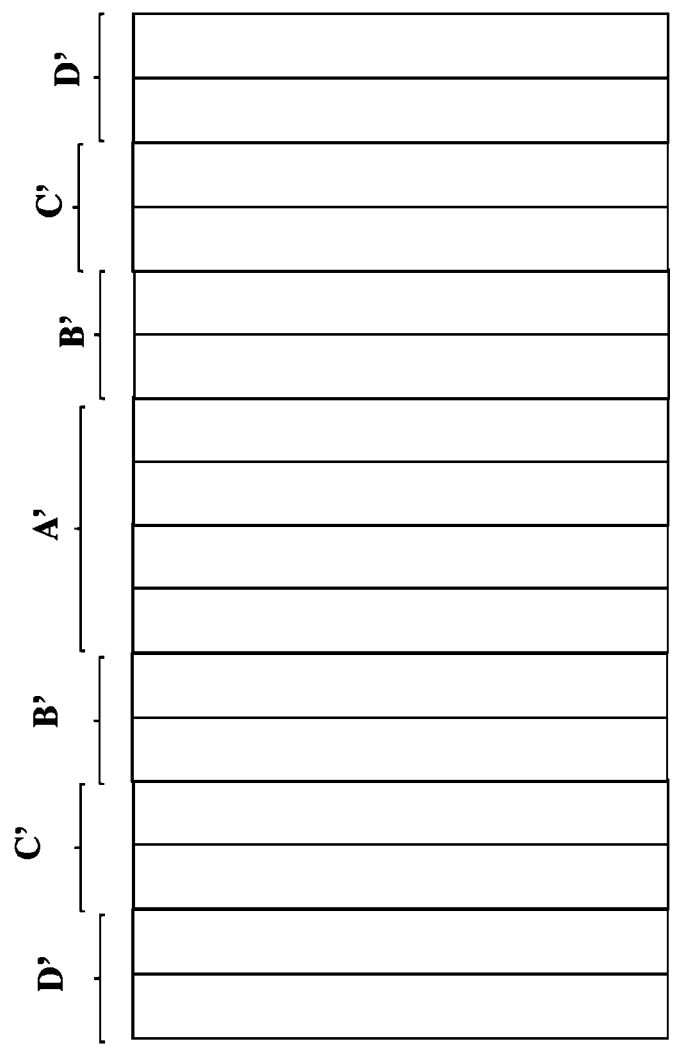
FIG. 8 is a top view illustrating various zones of the thermal processing system of FIG. 6 in accordance with some other embodiments.

The heating elements and heating zones shown in FIGS. 6 and 7 are concentric. If the work piece 104 is not circular, the heating elements and zones can be in different arrangements. For example, if the substrate is rectangular, the front-side and/or backside heating elements can be arranged in parallel, as shown in FIG. 8 in accordance with some embodiments. The heating elements in FIG. 8 could be a front heating source or backside heating source. The heating elements 178 are controlled by zones, such as zones A', B', C', and D'.

In some embodiments, the work piece 104 is initially heated with both the front-side and backside heat sources with at power levels at equal to or less than about 20% of the full powers of respective power sources. In some embodiments, the power of the front heating source is configured (or controlled) not to exceed 30% of the full power of the front-side power source. In some other embodiments, the power of the front heating source is configured (or controlled) not to exceed 20% of the full power of the front-side power source. However, backside heating source can use the full range of its power source. In some embodiments, the full power of the backside heating source is between about 50 KW (kilo watts) to about 250 KW. In some embodiments, the full power of the front heating source is also between about 30 KW to about 200 KW. In some other embodiments, the full power of the front heating source is between about 35 KW to about 175 KW and the front heating source can utilize its full power. In some embodiments, the front-side heat source contributes less than about 50% of total power used to raise the temperature of the substrate to the peak annealing temperature. In some other embodiments, the front-side heat source contributes to equal to or less than about 30% of total power used to raise the temperature of the substrate to the peak annealing temperature. Those data are only examples.

In some embodiments, the front heating source 112 is set as a first zone and the backside heating source 172 is set as a second zone. Through experiments, it was found that the heating effect from the backside heating source 172 has less pattern related temperature variation since the pattern 110 is formed on the front surface 106 of the work piece 104. In contrast, the heating effect from the front heating source 112 has much more pattern related temperature variation. In some approaches, the ratio of a first power P1 to the front heating source 112 over a second power P2 to the backside heating source 172 (as P1/P2) is tuned by the controller 126 to reduce the temperature variation associated with pattern density. The thermal profile is analyzed to extract the pattern related temperature variation. When the pattern related temperature variation is higher, the second power P2 is increased relative to the first power P1, or the power ratio P1/P2 is decreased to reduce the pattern related temperature variation. When the pattern related temperature variation is lower, the first power P1 is increased relative to the second power P2, or the power ratio P1/P2 is increased to maintain enough heating powers with the temperature variation in a tolerable range. In some embodiments, the historic data may be used to correlate the power ratio P1/P2 and the temperature variation, thereby building a chart of relational data. The chart of relational data may be stored in the database 150 and be used to determine the power ratio for controlling the heating powers in the feedback loop.

Figure 9:
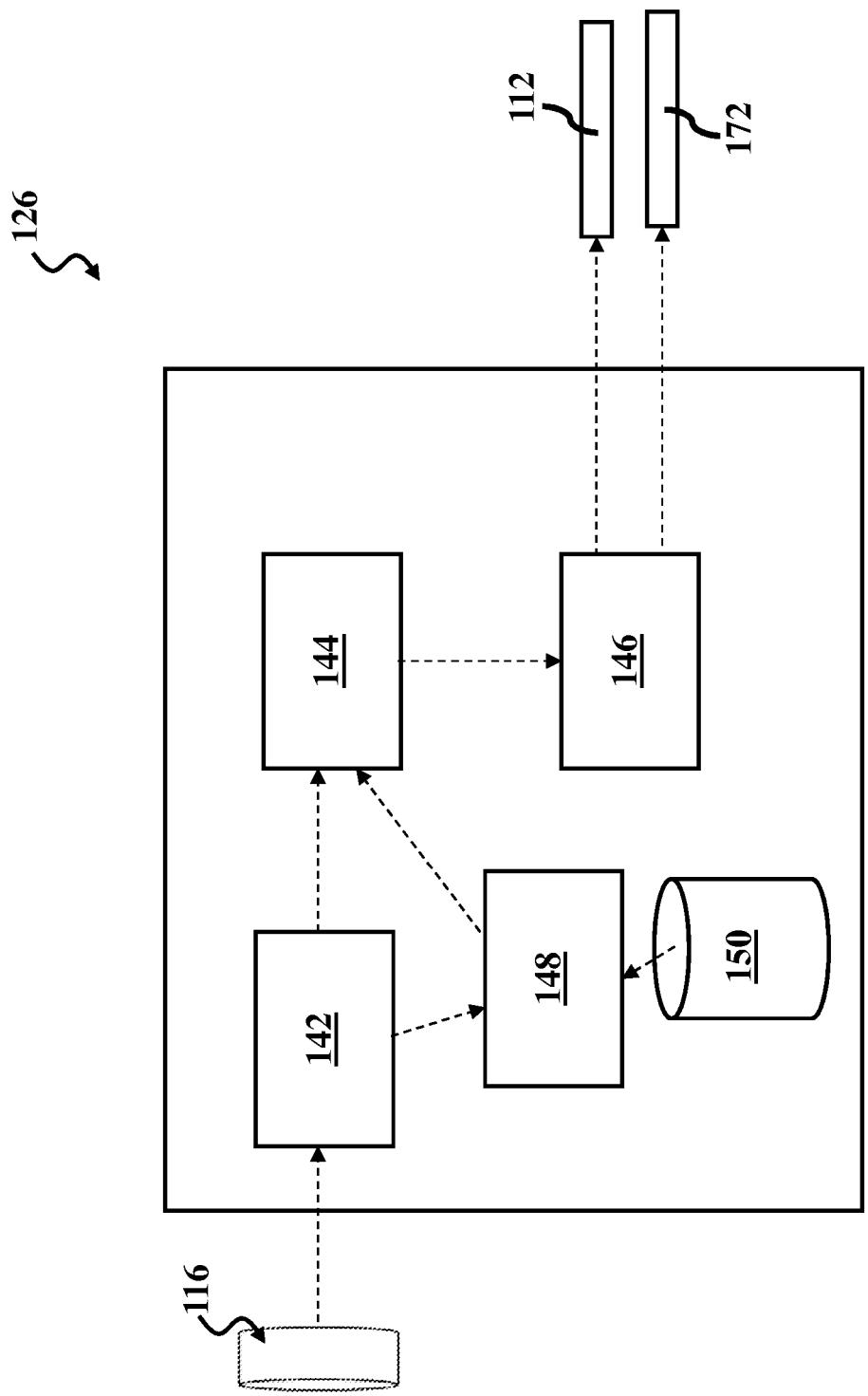
FIG. 9 is a block diagram of the controller in FIG. 6 in accordance with some embodiments.

FIG. 9 illustrates the controller 126 in accordance with some embodiments. It is similar to the controller 126 in FIG. 4. However, the power supply module 146 is designed to be coupled with both front heating source 112 and the backside heating source 172 to control the first power P1 and second power P2. In furtherance of the embodiments, the RTC 144 extract the pattern related temperature variation based on the thermal profile and determine the power ratio P1/P2 according to the pattern related temperature variation. According to the power ratio P1/P2 or additionally according to the overall power (P1+P2) (that is associated overall heating power need) to control the front heating source 112 with the first power P1 and the backside heating source 172 with the second power P2.

Figure 10:
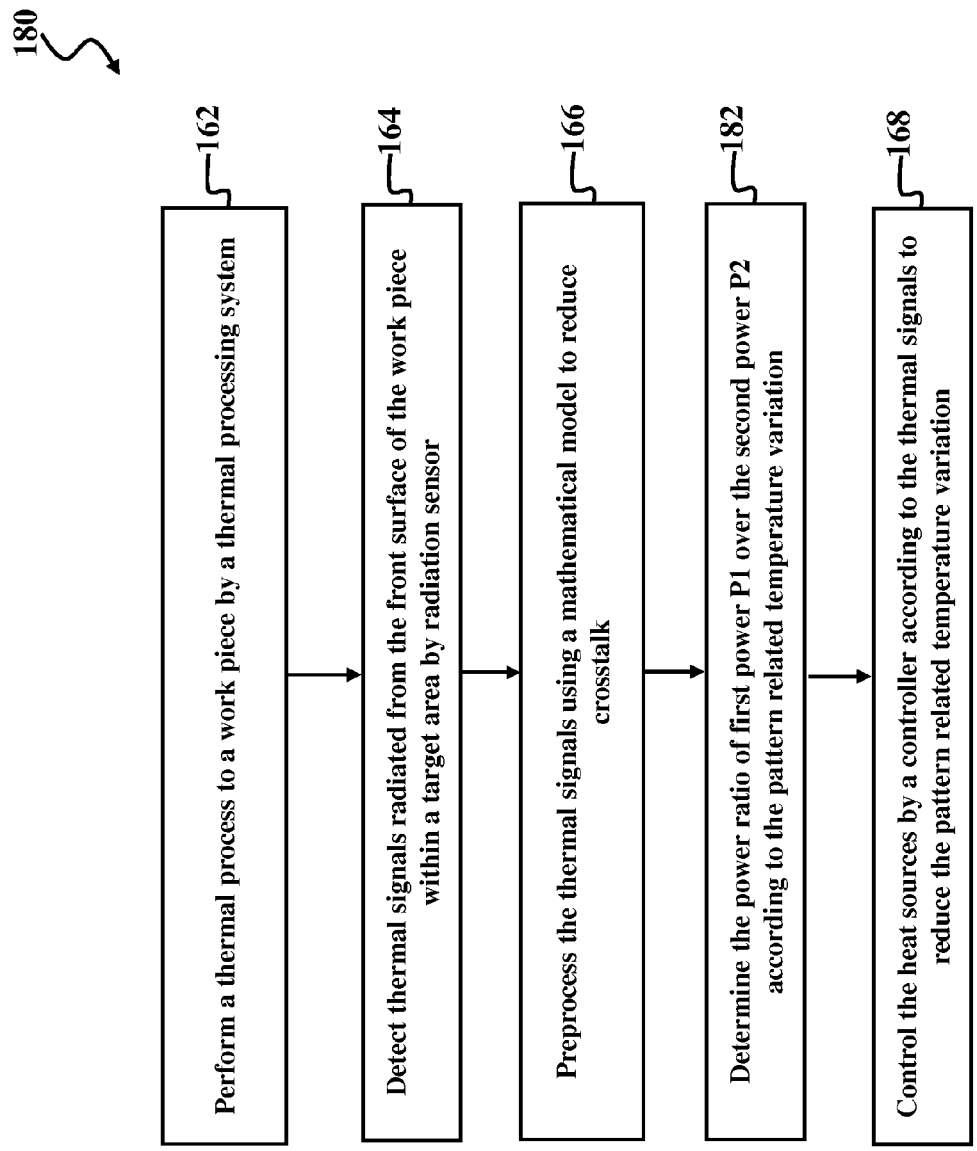
FIG. 10 is a flowchart of a method implemented with the thermal processing system of FIG. 6 in accordance with some embodiments.

FIG. 10 illustrates a flowchart for a thermal processing method 180 in accordance with some embodiments. The method 180 is similar to the method 160 in portions. For example, the method 180 includes the operation 162 by performing a thermal process to the work piece 104 by the thermal processing system 170, particularly, by both the front and backside heating sources (112 and 172). The method 180 includes the operation 164 by detecting the thermal signals radiated from the front surface 106 of the work piece 104 within the target area 132 by the radiations sensor 116. In the present embodiment, even the work piece 104 is heated by both heating sources (112 and 172) during the thermal process, the thermal signals are still extracted from the light radiated from the front surface of the work piece 104 because the circuit structure to be thermally processed is formed on the front surface 106 and further because the front surface temperature is more sensitive to the pattern 110 as noted before.

The method 180 may further include the operation 168 to preprocess the thermal signals using the mathematical model, such as eq. (1), to reduce the crosstalk and enhance the thermal profile resolution.

The method 180 further includes an operation 182 by determining the power ratio P1/P2 according to the pattern related temperature variation. The power ratio P1/P2 is increased when the pattern related temperature variation is higher as described above. The operation 182 may further include extracting the pattern related temperature variation according to the thermal profile. It is noted that the thermal profile is the temperature distribution from the front surface 106 within the target area 132. In some embodiments, the pattern related temperature variation is determined by the formula $T_v = Sqr\{Sum\ [T(r_i)-T_0]2\}$. In the formula, $T_v$ represents the pattern related temperature variation, "Sqr" stands for square root, "Sum" stands for summation over subareas $r_i$, $T(r_i)$ represents measured temperature of the subarea $r_i$, and $T_0$ represents an average temperature over all $T(r_i)$ in the target area.

The method 180 also includes the operation 168 by controlling the heating sources by the controller 126 according to the pattern related temperature variation. Particularly, the power ratio P1/P2 is determined by the operation 182. Thus, the heating sources are tuned with power ratio P1/p2 to reduce the temperature variation to be in a tolerable range.

In some embodiments, the method 180 is able to determine a temperature variation with spatial resolution less than 500 μm and at a temperature resolution of about 0.5° C. of the target area. In some embodiment, the first wavelength range is from about 0.35 μm to about 3 μm, and the second wavelength range is from about 3 μm to about 6 μm.

The present disclosure provides a thermal processing system and a method to use the same in accordance with many different embodiments. In some embodiments, the thermal processing system includes imaging mechanism, first and second filters. In some embodiments, the thermal processing system includes a controller designed and integrated to control the power ratio P1/P2 according to the temperature variation. In one example, the thermal processing system and the method using the same are designed for rapid thermal processing (RTP). However, the disclosed system and the method are not limited to RTP, and can be used in any proper fabrication system with need for thermal monitoring and controlling, especially for monitoring and controlling circuit pattern related temperature spatial variation. For example, the system 100 (or 170) may be a thermal oxidation system.

The present disclosure presents various advantages in different embodiments. For example, by using the thermal signals 117 radiated from the front surface 106 to determine the thermal profile of the target area, the thermal signals 117 will carry on the temperature variation associated with the pattern density of the substrate 104. In contrast, the thermal signals from the backside surface 108 will have no temperature variation associated with the pattern density or much less than that of the front surface 106, as explained above. Further, by the imaging mechanism 122 to catch the thermal signals from the target area within a chip 128 by the sensing pixels 130 of the radiation sensor 116, the thermal signals will carry enough temperature variation associated with the pattern density. Furthermore, by the disclosed system 100 and the corresponding method, the thermal profile of the target area of the substrate 104 is enhanced with better resolution. Particularly, by using the first filter 118 to block the radiation from the heating source 112 within the second wavelength range, the radiation 113 from heating source 112 within the first wavelength range is able to effectively heat the substrate 104 and avoids to be interfered with the target radiation (or radiation signals) within the second wavelength range, as the radiation signals being used for temperature determination by the radiation sensor 116. Further, by using the second filter 120, the light 117 radiated from the front surface 106 of the substrate 104 is further filtered out the portions beyond the second wavelength range to generate the radiation signals within the second wavelength range, the interference between radiation 113 from the heating source 112 and the radiation 117 from the substrate 104 is further reduced or eliminated. The thermal signals after the second filter 120 has high quality and less noise, since any radiation from the heating source is blocked by either the first filter 118 or the second filter 120. In some embodiments, the system includes the front heating source 112 and the backside heating source 172. The power ratio P1/p2 is tuned to reduce the temperature variation according to the obtained temperature variation and is feedback to the heating sources 112 and 172 for real time heating control in a closed loop control mode.

Thus, a thermal processing apparatus is provided in accordance with some embodiments. The thermal processing apparatus includes a heating source for transmitting incident radiation to a work piece having a circuit pattern formed on a front surface; a radiation sensor configured to receive light radiated from the front surface of the work piece; and a controller coupled to the radiation sensor, the controller being designed to control the heating source to reduce temperature variation of the work piece.

A thermal processing apparatus is provided in accordance with some embodiments. The apparatus includes a front heating source configured for transmitting a first incident radiation to a work piece from a front surface of the work piece, the work piece having a circuit pattern formed on the front surface; a backside heating source configured for transmitting a second incident radiation to the work piece from a backside surface of the work piece; a radiation sensor configured to detect light radiated from the front surface of the work piece; and a controller coupled to the radiation sensor, the controller being designed to provide a first power P1 to the front heating source and a second power P2 to the backside heating source, wherein the controller is operable to tune a power ratio P1/p2 according to a temperature variation of the work piece in a feedback loop.

A method for a thermal process is provided in accordance with some embodiments. The method includes providing a work piece in a thermal process chamber; radiating the work piece to heat the work piece using radiation from a heating source within a first wavelength range; receiving light radiated from a front surface of the work piece during the thermal process by a radiation sensor being sensitive to the light within a second wavelength range different from the first wavelength range; and determining a pattern related temperature variation according to the received light.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thermal processing apparatus, comprising:
   a heating source for transmitting incident radiation to a work piece having a circuit pattern formed on a front surface of the work piece;
   a radiation sensor configured to receive light radiated from the front surface of the work piece, wherein the radiation sensor is disposed at a level between the front surface of the work piece and the heating source; and
   a controller coupled to the radiation sensor, the controller being designed to control the heating source to reduce temperature variation of the work piece.

2. The apparatus of claim 1, further comprising a first filter configured adjacent to the heating source and designed such that the incident radiation from the heating source within a first wavelength range is directed to the work piece and the incident radiation from the heating source within a second wavelength range is blocked, wherein the second wavelength range is different from the first wavelength range.

3. The apparatus of claim 2, further comprising a second filter configured adjacent the radiation sensor to filter the light radiated from the front surface of the work piece prior to reaching the radiation sensor, wherein the second filter passes the light within the second wavelength range.

4. The apparatus of claim 2, wherein the second wavelength range is complimentary to the first wavelength range and wherein the radiation sensor is designed to be responsive to the light within second wavelength range.

5. The apparatus of claim 2, further comprising:
   a window integrated into lateral wall of the processing chamber at an elevation above the substrate stage and below the heating source, wherein the radiation sensor is positioned to receive light radiated from the front surface of the work piece through the window in the lateral wall of the processing chamber.

6. The apparatus of claim 1, wherein the radiation sensor includes a plurality sensing pixels configured in an array and is configured adjacent a viewport window of the thermal processing apparatus.

7. The apparatus of claim 6, further comprising an imaging module configured between the work piece and the radiation sensor to image the light radiated from the front surface of the work piece within a target area to the sensing pixels.

8. The apparatus of claim 7, wherein the imaging module includes at least one lens to focus the light radiated from the front surface to the sensing pixels of the radiation sensor.

9. The apparatus of claim 7, wherein the imaging module includes a mechanism to vary a size of the target area.

10. The apparatus of claim 7, wherein the imaging module includes a mechanism to reposition the target area to a different location on the front surface of the work piece.

11. The apparatus of claim 7, wherein
the plurality of sensing pixels of the radiation sensor are formed on a semiconductor substrate; and
the imaging module is integrated with the radiation sensor and formed on the semiconductor substrate.

12. The apparatus of claim 11, wherein a second filter is integrated with the radiation sensor and formed on the semiconductor substrate.

13. The apparatus of claim 2, wherein the first wavelength range is from about 0.35 µm to about 3 µm and the second wavelength range is from about 3 µm to about 6 µm.

14. The apparatus of claim 1, wherein the controller includes a resolution enhancer designed to preprocess the light detected by the radiation sensor using a mathematical model to reduce crosstalk among different sensing pixels.

15. The apparatus of claim 14, wherein the mathematical model is defined as $$I(r_i) = \Sigma C(r_i, r_j) * S(r_j)$$

where sum $\Sigma$ is over subscript j; subscripts i and j are integrals ranging from 1 to a total number of subareas in a target area; parameter $r_i$ represents ith subarea; $S(r_j)$ is a total radiation signal received by a sensing pixel paired with a subarea $r_j$; $I(r_i)$ represents a total radiation intensity from the subarea $r_i$; and $C(r_i, r_j)$ is a matrix of coefficients associated with crosstalk.

16. The apparatus of claim 1, wherein
the heating source includes a front heating source configured adjacent the front surface of the work piece and a backside heating source configured adjacent a backside surface of the work piece;
the controller is designed to provide a first power P1 to the front heating source and a second power P2 to the backside heating source; and
the controller is operable to tune a power ratio P1/P2 according to a pattern related temperature variation.

17. A thermal processing apparatus, comprising:
a front heating source configured for transmitting a first incident radiation to a work piece from a front surface of the work piece, the work piece having a circuit pattern formed on the front surface;
a backside heating source configured for transmitting a second incident radiation to the work piece from a backside surface of the work piece;
a radiation sensor configured to detect light radiated from the front surface of the work piece, wherein the radiation sensor is disposed at a level between the front heating source and the backside heating source; and
a controller coupled to the radiation sensor, the controller being designed to provide a first power P1 to the front heating source and a second power P2 to the backside heating source, wherein the controller is operable to tune a power ratio P1/P2 according to a temperature variation of the work piece in a feedback loop.

18. The apparatus of claim 17, wherein the controller is operable to decrease the power ratio to reduce the temperature variation.

19. A method for a thermal process, comprising:
providing a work piece in a thermal processing chamber;
radiating the work piece, thereby heating the work piece, using radiation from a heating source within a first wavelength range;
receiving, at a radiation sensor disposed at a level between a front surface of the work piece and the heating source, light radiated from a front surface of the work piece during the thermal process by a radiation sensor being sensitive to the light within a second wavelength range different from the first wavelength range; and
determining a pattern related temperature variation according to the received light.

20. The method of claim 19, further comprising controlling the heating source according to the temperature variation by a controller, wherein
the heating source further includes a front heating source configured to heat the front surface of the work piece;
the heating source further includes a backside heating source configured to heat a backside surface of the work piece; and
the controller is designed to provide a first power P1 to the front heating source and a second power P2 to the backside heating source, and the controller is operable to tune a power ratio P1/P2 according to the pattern related temperature variation in a feedback loop.

* * * * *